(12) United States Patent
Chen et al.

(10) Patent No.: US 7,259,050 B2
(45) Date of Patent: Aug. 21, 2007

(54) SEMICONDUCTOR DEVICE AND METHOD OF MAKING THE SAME

(75) Inventors: Chien-Hao Chen, Jhuangwei Township, Ylian County (TW); Chia-Lin Chen, Hsin-Chu (TW); Tze Liang Lee, Hsin-Chu (TW); Shih-Chang Chen, Taoyuang (TW); Ju-Wang Hsu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 258 days.

(21) Appl. No.: 10/834,474

(22) Filed: Apr. 29, 2004

(65) Prior Publication Data

US 2005/0242376 A1    Nov. 3, 2005

(51) Int. Cl.
*H01L 21/338*    (2006.01)
(52) U.S. Cl. .................. 438/184; 438/303; 438/366; 438/595
(58) Field of Classification Search .............. 438/184, 438/197, 230, 265, 303, 366, 595; 257/214, 257/215, 344, 347, E21.626, E21.64, 900
See application file for complete search history.

(56) References Cited

U.S. PATENT DOCUMENTS

| | | | |
|---|---|---|---|
| 5,399,387 A * | 3/1995 | Law et al. ................... 427/574 |
| 6,316,302 B1 * | 11/2001 | Cheek et al. ................ 438/199 |
| 6,506,653 B1 * | 1/2003 | Furukawa et al. ........... 438/305 |
| 6,551,887 B2 * | 4/2003 | Kwon et al. ................. 438/305 |
| 6,764,911 B2 * | 7/2004 | Hsu et al. .................... 438/303 |
| 6,777,283 B2 * | 8/2004 | Maeda ........................ 438/231 |
| 6,835,640 B2 * | 12/2004 | Lee et al. .................... 438/595 |
| 6,884,464 B2 * | 4/2005 | Luo et al. .............. 427/255.29 |
| 6,991,991 B2 * | 1/2006 | Cheng et al. ................ 438/303 |
| 7,064,071 B2 * | 6/2006 | Schwan ....................... 438/696 |
| 2001/0041398 A1 * | 11/2001 | Angello et al. ............. 438/197 |
| 2002/0192868 A1 * | 12/2002 | Kim ............................ 438/112 |
| 2005/0074941 A1 * | 4/2005 | Nagatomo ................... 438/301 |
| 2005/0272213 A1 * | 12/2005 | Wang et al. ................. 438/303 |

OTHER PUBLICATIONS

Gregory Scott et al., "NMOS Drive Current Reduction Caused by Transistor Layout and Trench Isolation Induced Stress", 1999, pp. 34.4.1-34.4.4, 0-7803-5410-9/99, IEDM 99-827.
Shinya Ito et al., "Mechanical Stress Effect of Etch-Stop Nitride and its Impact on Deep Submicron Transistor Design", 2000, pp. 10.7.1-10.7.4, 0-7803-6438-4/00, IEDM 00-247.
A. Shimizu et al., "Local Mechanical-Stress Control (LMC): A New Technique for CMOS-Performance Enhancement", 2001, pp. 19.4.1-19.4.4, 0-7803-7050-3/01, IEDM, 01-433.
Yasuo Nara et al., "Process and Device Technologies for High-Performance 0.13 μm FCRAM", Jun. 2003, pp. 62-71, vol. 39, No. 1, FUJITSU Sci. Tech. J.

* cited by examiner

*Primary Examiner*—Matthew Smith
*Assistant Examiner*—Khiem D Nguyen
(74) *Attorney, Agent, or Firm*—Haynes and Boone, LLP

(57) ABSTRACT

A semiconductor device comprises a substrate, a gate disposed on the substrate, and a source and drain formed in the substrate on both sides of the gate. The device further comprises a thin spacer having a first layer and a second layer formed on the sidewalls of the gate, wherein the first and second layers have comparable wet etch rates of at least 10 Å per minute using the same etchant.

25 Claims, 2 Drawing Sheets

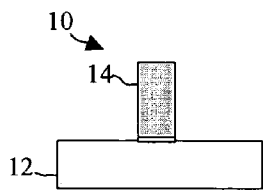
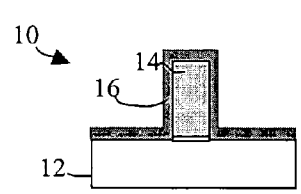
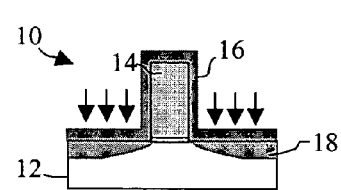
FIG. 1a    FIG. 1b    FIG. 1c
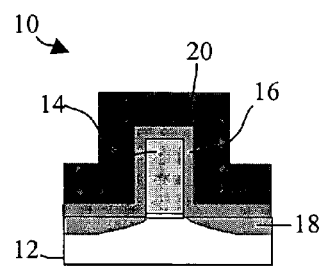
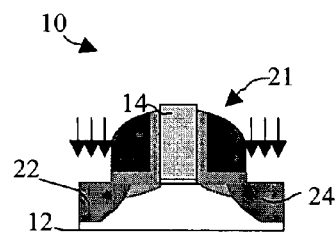
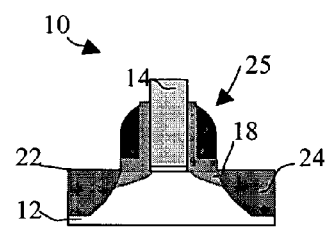
FIG. 1d    FIG. 1e    FIG. 1f
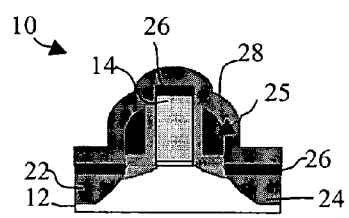
FIG. 1g

SEMICONDUCTOR DEVICE AND METHOD OF MAKING THE SAME

BACKGROUND

Semiconductor device performance is related to carrier mobility. For example, in metal-oxide semiconductor (MOS) devices, the higher the carrier mobility in the channel of the device, the faster the current can flow in the channel and the faster the device can perform.

Carrier mobility is determined by properties of the semiconductor material such as its lattice constant. Stress in the semiconductor substrate can change the lattice constant and thus the carrier mobility. One way to add stress to the substrate is to add a contact etch stop layer. Further, the thickness of the spacers on the sidewalls of the gate electrode also affect the effect of stress on the substrate. Thick spacers reduce the desirable impact of the strained contact etch stop. However, thick spacers are desirable during the manufacture of semiconductor devices to control short channel effects. Therefore, there is an inherent conflict on the spacer thickness to achieve a well-performing semiconductor device.

BRIEF DESCRIPTION OF THE DRAWINGS

FIGS. 1a through 1g are simplified sectional views of a semiconductor device at selected stages of manufacture;

SUMMARY OF THE INVENTION

Figure 2:
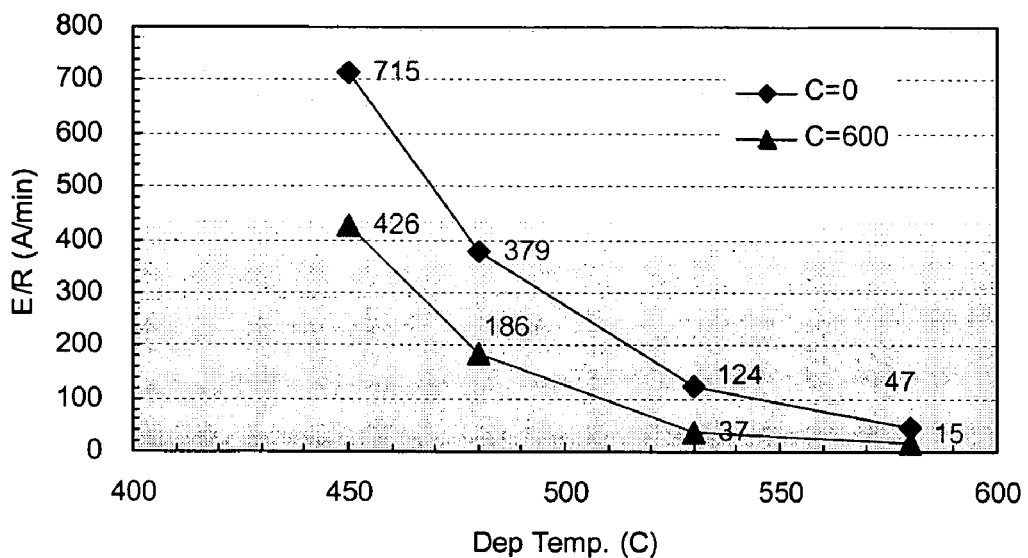
FIG. 2 is a diagram of low pressure chemical vapor deposition (LPCVD) hexachlorodisilane (HCD) silicon nitride (SiN) spacer with high hydrofluoric acid (HF) etch rate at various temperatures.

In one embodiment, a method of forming a semiconductor device comprises forming a gate on a semiconductor substrate, forming a first spacer layer, forming shallow lightly-doped regions on both sides of the gate in the substrate and being offset from the gate by the first spacer layer, forming a second spacer layer over the first spacer layer, etching the first and second spacer layers to form a thick spacer, forming source and drain regions on both sides of the gate in the substrate and being offset from the gate by the thick spacer, and etching the thick spacer to form a thin spacer.

In another embodiment, a semiconductor device comprises a substrate, a gate disposed on the substrate, a source and drain formed in the substrate on both sides of the gate, and a thin spacer having a liner layer and a nitrogen-containing layer formed on the sidewalls of the gate, wherein the liner layer and the nitrogen-containing layer have comparable hydrofluoric acid etch rates.

In yet another embodiment, a semiconductor device comprises a substrate, a gate disposed on the substrate, and a source and drain formed in the substrate on both sides of the gate. The device further comprises a thin spacer having a first layer and a second layer formed on the sidewalls of the gate, wherein the first and second layers have comparable wet etch rates of at least 10 Å per minute using the same etchant.

DETAILED DESCRIPTION

FIGS. 1a through 1g are simplified sectional views of a semiconductor device 10 at selected states of manufacture to illustrate an embodiment of a method of making the device. In FIG. 1a, a gate structure 14 is formed over a semiconductor substrate 12. Semiconductor substrate 12 may be silicon, strained silicon, silicon germanium (SiGe), silicon on insulator (SOI), or another suitable material. Gate structure 14 may be a stack structure comprising a dielectric layer with a polysilicon layer disposed thereon. Other materials such as doped polysilicon, silicon germanium, metal, silicide, etc. may also be used to form the gate electrode. The gate dielectric may be formed with oxide, nitrided oxide, nitride, a high dielectric constant (k) material, silicate, multiple film stacks, or another suitable material or composition. The gate dielectric may be formed using a technique such as chemical vapor deposition (CVD), for example. Lithography techniques may be used to pattern and form gate structure 14. The gate structure may be a single gate structure, a multiple gate structure, a FinFET gate structure, or a T-gate structure, for example.

In FIG. 1b, a spacer liner layer 16 is formed or deposited over gate structure 14 and substrate 12. Spacer liner layer 16 may be an oxide, a nitrided oxide, a nitride, a high k material, or a low k material, for example. The thickness of spacer liner 16 may range from about 1 to 50 nanometers (nm), for example. Preferably, the thickness of spacer liner 16 ranges between about 2 to 10 nm. The precursor material or gaseous reactants may include TEOS (tetraethyl orthosilicate, $Si(OC_2H_5)_4$), TRIES (triethoxysilane), BTBAS (bis tertbutylamino silane), $HCD_0$, $O_2$, $N_2O$, NO, or other materials. The deposition method used to form the spacer liner may be LPCVD (low pressure CVD), PECVD (plasma enhanced CVD), HDP-CVD (high density plasma CVD), APCVD (atmospheric pressure CVD), radical enhanced CVD, ATD (atomic layer deposition), ATCVD (atomic layer CVD), or other methods now known or later developed.

In FIG. 1c, ions of an appropriate material is implanted into substrate 12 to form lightly doped drain (LDD) 18 or a pocket structure through liner oxide layer 16 on both sides of gate stack 14. Spacer liner 16 serves as an offset for lightly doped drain implantation. In FIG. 1d, a silicon nitride (SiN) spacer layer 20 is deposited over spacer liner layer 16. Silicon nitride layer 20 may be deposited by a chemical vapor deposition technique such as LPCVD or a method enumerated above. The precursor reactant may include HCD (hexachlorodisilane), BTBAS, DCS (dichlorosilane, $SiH_2Cl_2$), DS (?), $SiH_4$, $NH_3$, $C_3H_4$, $N_2$, or another suitable material. The process parameters of the chemical vapor deposition step may be tuned so that the hydrofluoric acid (HF) etch rate of silicon nitride layer 20 is high and compatible with the hydrofluoric acid etch rate of the spacer liner. For example, the deposition temperature, pressure, gas flow rate, precursor, and dopant concentration may be set so that the resultant hydrofluoric acid etch rate of silicon nitride layer 20 ranges from about 30 to about 1000 Å per minute at about 100:1 hydrofluoric acid concentration at room temperature. Low deposition temperatures such as less than 630° C. may be used. A chamber pressure of about 0.1 torr to about 10 torr may be used. The nitrogen concentration of spacer layer 20 may range from 1 to 70% in atomic percentage. Spacer layer 20 may further comprise dopants such as carbon, oxygen, fluorine, chlorine, boron, arsenic, etc. The resultant etch rate of silicon nitride layer 20 is preferably the same as the oxide spacer liner 16. Thereafter, spacer layer 20 and spacer liner 16 are both etched back to form a thick spacer structure 21 as shown in FIG. 1e. The spacer thickness may range from about 1 nm to about 200 nm, for example. A suitable dry etch technique may be used to form thick spacer 21.

In FIG. 1e, source and drain regions 22 and 24 are formed by implanting an appropriate impurity. Alternatively, semiconductor device 10 may comprise raised SiGe drain and source regions or another suitable structure. In FIG. 1f, thick spacer 21 is further etched back to form a thin spacer 25 and then source and drain regions 22 and 24 are annealed. Alternatively, the annealing step may be performed prior to the spacer etch back step. The anneal step may comprise a rapid thermal anneal, a laser anneal, or a furnace anneal, for example. The anneal step also shrinks and densifies the spacer layer without the use of phosphoric acid ($H_3PO_4$) etching. The shrink rate of the spacer layer may be controlled by the deposition parameters when the spacer layer was formed. Because the etch rate of phosphoric acid is difficult to control and unstable, phosphoric acid etching is undesirable. Therefore, hydrofluoric acid etching to form the spacer is desired. As an example, the etch rate using hydrofluoric acid may range from about 30 to about 1000 Å per minute at about 49% HF to $H_2O$ in the ratio of about 1:100 at room temperature. After annealing, the spacer etch rate may range from about 10 to about 500 Å per minute at about 49% solution of HF to $H_2O$ in the ratio of about 1:100 at room temperature.

In FIG. 1g, a silicide layer 26 is formed on the source, drain and gate electrode. Silicide layer 26 may be, for example, cobalt silicide ($CoSi_2$), nickel silicide ($NiSi_2$), titanium silicide ($TiSi_2$), molibdenum silicide, ($MoSi_2$), platinum silicide (PtSi), tungsten silicide ($WSi_2$), tantalum silicide ($TaSi_2$), etc. Silicide layer 26 may range in thickness from about 3 nm to about 100 nm. Thereafter, a contact etch stop (CES) layer 28 is formed over the source, drain and gate of device 10. Contact etch stop layer 28 may be constructed of silicon nitride formed using a deposition technique. Contact etch stop 28 may be formed from a highly strained silicon nitride film having stress ranging from about −2 giga-pascal (Gpa) to about 2 Gpa and a thickness of about 100 to about 1000 Å. Contact etch stop layer 28 may be an oxide, a nitride, an oxynitride, a doped nitride, or a multiple film stack structure, for example. Thereafter, a metallization process to form source, drain and gate contacts is performed.

Figure 3:
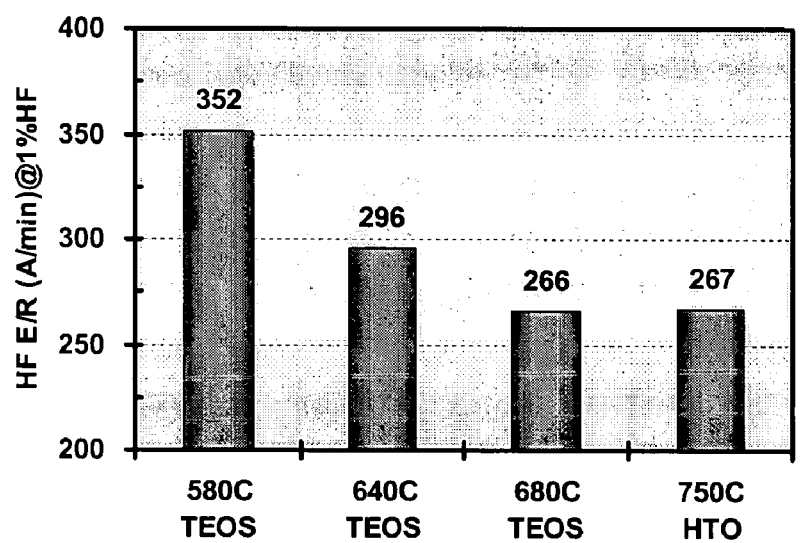
FIG. 3 is a diagram of low pressure chemical vapor deposition (LPCVD) (TEOS) (tetraethyl orthosilicate) oxide with high hydrofluoric acid (HF) etch rate at various temperatures.

FIG. 2 is a diagram of low pressure chemical vapor deposition HCD SiN with high hydrofluoric acid etch rate at various temperatures. Spacer layer 20 preferably has a high etch rate that is compatible with the etch rate of spacer liner 16 so that both may be etched back using the same etch process. The etch rate may be fine-tuned by modifying the deposition parameters such as temperature, pressure, gas flow rate, and doping. The etch rates of the spacer liner and spacer layer should enable the hydrofluoric acid wet etch process to achieve the desired thin spacer profile. As shown in FIG. 2, the etch rates of silicon nitride with and without carbon doping at various temperatures can be compared with the etch rates of TEOS oxide at various temperatures shown in FIG. 3.

Therefore, advantages associated with having a thick spacer during source and drain ion implantation such as the ability to control short channel effect are still realized. After source and drain implantation, the thick spacer is etched back. The thin spacer structure is achieved by shrinkage during annealing of the source and drain formation and primarily by the hydrofluoric acid wet etch process. The spacer liner and the spacer layer are formed with process parameters that contribute to an etch rate that is compatible so that both are etched back in the same etch process. This process thus produces a slim spacer profile without the use of phosphoric acid etching, which is unreliable and difficult to control. The thin spacer structure of the resultant semiconductor device enables the stress induced by a strained channel etch stop to have full impact on carrier mobility and desirable device performance.

What is claimed is:

1. A method of forming a semiconductor device, comprising:
   forming a gate on a semiconductor substrate;
   forming a first spacer layer;
   forming shallow lightly-doped regions on both sides of the gate in the substrate and being offset from the gate by the first spacer layer;
   forming a second spacer layer having an etch rate comparable to an etch rate of the first spacer layer over the first spacer layer;
   etching the first and second spacer layers to form a thick spacer;
   forming source and drain regions on both sides of the gate in the substrate and being offset from the gate by the thick spacer; and
   etching the thick spacer to form a thin spacer by etching the first and second spacer layers during the same etching step.

2. The method, as set forth in claim 1, wherein etching the thick spacer comprises etching the thick spacer using hydrofluoric acid.

3. The method, as set forth in claim 1, wherein forming a second spacer layer having an etch rate comparable to an etch rate of the first spacer layer over the first spacer layer comprises selecting processing parameters to form a second spacer layer having a high hydrofluoric acid etch rate.

4. The method, as set forth in claim 1, wherein forming a second spacer layer having an etch rate comparable to an etch rate of the first spacer layer over the first spacer layer comprises selecting processing parameters to form a second spacer layer having an etch rate comparable to the etch rate of the first spacer layer using the same etchant.

5. The method, as set forth in claim 1, wherein forming a second spacer layer having an etch rate comparable to an etch rate of the first spacer layer over the first spacer layer comprises depositing a silicon nitride layer at a temperature less than 630° C. with high hydrofluoric acid etch rate of at least 10 Å per minute.

6. The method, as set forth in claim 1, wherein forming a first and second spacer layers comprise forming a first spacer layer having silicon oxide and forming a second spacer layer containing nitrogen.

7. The method, as set forth in claim 1, wherein etching the first and second spacer layers to form a thick spacer comprises dry etching the first and second spacer layers.

8. The method, as set forth in claim 1, wherein etching the thick spacer comprises wet etching the thick spacer using hydrofluoric acid.

9. The method, as set forth in claim 1, further comprising annealing the source and drain regions and thereby shrinking the second spacer layer.

10. The method, as set forth in claim 1, further comprising annealing the source and drain regions and thereby shrinking the thick spacer.

11. The method, as set forth in claim 1, further comprising forming a contact etch stop layer over the substrate.

12. The method, as set forth in claim 1, wherein forming the second spacer layer comprises using a precursor selected from the group consisting of HCD, BTBAS, DCS, DS, $SiH_4$, $NH_3$, $C_2H_4$ and $N_2$.

13. A method of manufacturing a semiconductor device, comprising:
    forming a gate stack on a substrate by forming a dielectric layer on the substrate via chemical vapor deposition (CVD), forming a polysilicon layer on the dielectric layer, and patterning the dielectric and polysilicon layers via lithography to define the gate stack;
    forming a spacer liner layer over the gate stack and the substrate, the spacer liner layer comprising at least one of an oxide, a nitrided oxide, a nitride, a high-k material or a low-k material;
    forming lightly doped source and drain regions on opposing sides of the gate stack by implanting ions into the substrate through the spacer liner layer;
    forming via CVD a silicon nitride (SiN) spacer layer on the spacer liner layer, wherein the SiN spacer layer and the spacer liner layer have comparable etch rates;
    etching the SiN spacer layer and the spacer liner layer with a dry etch technique in the same etching step to form a thick spacer;
    forming source and drain regions by implanting an impurity into the substrate;
    etching the thick spacer to form a thin spacer;
    annealing the source and drain regions, the SiN spacer layer and the spacer liner layer;
    forming a silicide layer on the source region, the drain region and the gate stack;
    depositing a contact etch stop (CES) layer on the source region, the drain region and the gate stack; and
    forming source, drain and gate contacts contacting corresponding portions of the silicide layer over source, the drain and the gate stack.

14. The method of claim 13 wherein forming the gate stack on the substrate comprises forming at least one of a single gate structure, a multiple gate structure, a FinFET gate structure and a T-gate structure on a semiconductor substrate comprising at least one of silicon, strained silicon, silicon germanium and silicon on insulator.

15. The method of claim 14 wherein the dielectric layer comprises at least one of oxide, nitrided oxide, nitride, a high-dielectric constant (k) material and silicate.

16. The method of claim 15 wherein the spacer liner layer has a thickness ranging between about 2 nm and about 10 nm.

17. The method of claim 16 wherein forming the spacer liner layer comprises at least one of low pressure CVD (LPCVD), plasma enhanced CVD) (PECVD), high density plasma CVD) (HDP-CVD), atmospheric pressure CVD (APCVD), radical enhanced CVD, atomic layer deposition (ATD) and atomic layer CVD (ATCVD).

18. The method of claim 17 wherein forming the spacer liner layer comprises using a precursor material comprising at least one of tetraethyl orthosilicate (TEOS), triethoxysilane (TRIES), bis tertbutylamino silane (BTBAS), HCDO, $O_2$, $N_2O$ and NO.

19. The method of claim 18 wherein forming the SiN spacer layer includes using a precursor material comprising at least one of hexachlorodisilane (HCD), BTBAS, dichlorosilane (DCS), $SiH_2Cl_2$, disilane (DS), $SiH_4$, $NH_3$, $C_3H_4$ and $N_2$.

20. The method of claim 19 wherein forming the SiN spacer layer includes using a deposition temperature of about 630° C.

21. The method of claim 20 wherein forming the SiN spacer layer includes using a chamber pressure ranging between about 0.01 torr and about 10 torr.

22. The method of claim 21 wherein forming the SiN spacer layer includes doping the spacer layer with at least one of carbon, oxygen, fluorine, chlorine, boron and arsenic.

23. The method of claim 22 wherein etching the SiN spacer layer and the spacer liner layer to form the thick spacer comprises etching the SiN spacer layer and the spacer liner layer at a rate ranging between about 30 and about 1000 Å per minute with an etchant comprising 49% HF and $H_2O$ in a ratio of about 1:100 at room temperature.

24. The method of claim 23 wherein the CES layer comprises at least one of:
    silicon nitride;
    a highly strained silicon nitride film having stress ranging between about −2 Gpa and about 2 Gpa and a thickness ranging between about 100 and about 1000 Å;
    an oxide;
    a nitride;
    an oxynitride;
    a doped nitride; and
    a multiple film structure.

25. A method of manufacturing a semiconductor device, comprising:
    forming a gate stack on a substrate;
    forming a first spacer layer on the gate stack, on sidewalls of the gate stack, and on the substrate on opposing sides of the gate, wherein the first spacer layer comprises an oxide and has a first etch rate;
    forming lightly doped regions in the substrate on opposing sides of the gate by implanting through portions of the first spacer layer formed on the substrate, and then forming a second spacer layer on the first spacer layer, wherein the second spacer layer comprises silicon nitride deposited by chemical vapor deposition (CVD) and has a high hydrofluoric etch rate comparable to the first etch rate of the first spacer layer;
    dry etching the first and second spacer layers to form a thick spacer;
    forming source and drain regions in the substrate on opposing sides of the gate by implanting around the thick spacer;
    etching the thick spacer to form a thin spacer by etching the first and second spacer layers in the same etch step using an etchant comprising hydrofluoric acid;
    forming a metal silicide on the source and drain regions of the substrate and on the gate stack; and
    depositing silicon nitride to form a contact etch stop layer.

* * * * *